United States Patent
Carney et al.

[19]

[11] Patent Number: 5,937,011
[45] Date of Patent: Aug. 10, 1999

[54] MULTI-CARRIER HIGH POWER AMPLIFIER USING DIGITAL PRE-DISTORTION

[75] Inventors: Ronald R. Carney, Palm Bay; Michael A. Komara, Indialantic, both of Fla.

[73] Assignee: AirNet Communications Corp., Melbourne, Fla.

[21] Appl. No.: 08/622,060

[22] Filed: Mar. 26, 1996

[51] Int. Cl.$^6$ .................................................. H04L 25/49
[52] U.S. Cl. ........................................................... 375/297
[58] Field of Search ..................................... 375/296, 297, 375/278, 284, 285; 330/291, 149; 455/63

[56] References Cited

U.S. PATENT DOCUMENTS

| | | | |
|---|---|---|---|
| 4,291,277 | 9/1981 | Davis et al. | 375/297 |
| 4,700,151 | 10/1987 | Nagata | 375/297 |
| 5,524,286 | 6/1996 | Chiesa et al. | 375/297 |
| 5,598,436 | 1/1997 | Brajal et al. | 375/297 |

*Primary Examiner*—Temesghen Ghebretinsae
*Attorney, Agent, or Firm*—Farkas & Manelli, P.L.L.C.

[57] ABSTRACT

A distortion correction technique for use with a high power amplifier (HPA) in a multi-carrier radio signaling system such as a cellular base station. Distortion correction is implemented by making use of a broadband digital composite signal input to the high power amplifier as a reference signal in a form of intermediate frequency (IF) distortion correction circuit. A multichannel synthesizer provides the broadband composite signal to a broadband digital radio which in turn provides an input to the (HPA). A portion of the output signal from the HPA is fed back through a radio frequency (RF) and intermediate frequency (IF) down-conversion stage that uses the same IF and RF local oscillators that were used to generate the input signal to the HPA. This feedback signal is fed to a predistortion processor together with a version of the composite digital signal. The predistortion processor may perform a first crude amplitude correction procedure by finding a difference between the HPA feedback signal and the composite signal, to provide an offset to be loaded into a look-up table which is disposed between the broadband digital synthesizer and the broadband digital radio,. Subsequent precise correction and distortion correction procedures are performed using the offset value.

10 Claims, 5 Drawing Sheets

MULTI-CARRIER HIGH POWER AMPLIFIER USING DIGITAL PRE-DISTORTION

FIELD OF THE INVENTION

This invention relates generally to power amplifiers and in particular to a distortion correction technique for a high power amplifier that is used to transmit a composite digital signal representing multiple radio channels.

BACKGROUND OF THE INVENTION

The demand for cellular and other multichannel wireless communications systems has led to development of broadband transceiver systems that are capable of processing many radio channels in parallel. While broadband transmission and reception of many radio channels in parallel through the use of sophisticated digital signal processing techniques provides an ultimate advantage of compact size and low price, this comes at the cost of more sophisticated, expensive, and sensitive radio equipment.

One such system component is the high power amplifier which must impart sufficient energy in the transmitted signal to close the communication link over distances of several miles to the mobile and portable subscriber units. Since the HPA is transmitting many channels in parallel, it must operate as linearly as possible, and impart as little distortion as possible in the resulting transmitted waveform.

For example, certain digital cellular protocols such as Global System for Mobile Communications (GSM) specify that the intermodulation distortion between adjacent channels must be at levels of −70 decibels (dB) or less.

DESCRIPTION OF THE INVENTION

OBJECTS OF THE INVENTION

It is an object of this invention to provide for distortion correction in a high power amplifier which is intended for use in a multi-carrier radio signaling system such as a cellular base station that makes use of broadband processing techniques.

A further object is to permit the implementation of distortion correction in a multi-carrier power amplifier by making use of a digital composite signal input to the high power amplifier as reference signal in a form of intermediate frequency (IF) distortion correction circuit.

SUMMARY OF THE INVENTION

Briefly, the invention is a wideband multi-carrier high power amplifier (HPA) that makes use of a broadband digital predistortion linearization technique to provide high power amplification of complex multi-carrier waveforms. In this arrangement, a multichannel synthesizer feeds a broadband digital radio, which in turn provides the input signal to the HPA. The predistortion technique feeds back a portion of the output signal from the HPA through a radio frequency (RF) and intermediate frequency (IF) downconversion stage that uses the same IF and RF local oscillators that were used to generate the input signal to the HPA. This feedback signal from the HPA is digitized and fed to a predistortion processor together with a version of the composite digital signal generated by the broadband digital synthesizer.

The predistortion processor may perform a first crude amplitude correction procedure by finding a difference between the HPA feedback signal and the composite signal, to provide an offset to be loaded into a look-up table which is disposed between the broadband digital synthesizer and the broadband digital radio.

Subsequent precise correction procedure and distortion correction procedures are performed using the offset value.

BRIEF DESCRIPTION OF THE DRAWINGS

For a more complete understanding of the invention and its novel advantages and features, reference should be made to the accompanying drawings in which.

DETAILED DESCRIPTION OF A PREFERRED EMBODIMENT

Figure 1:
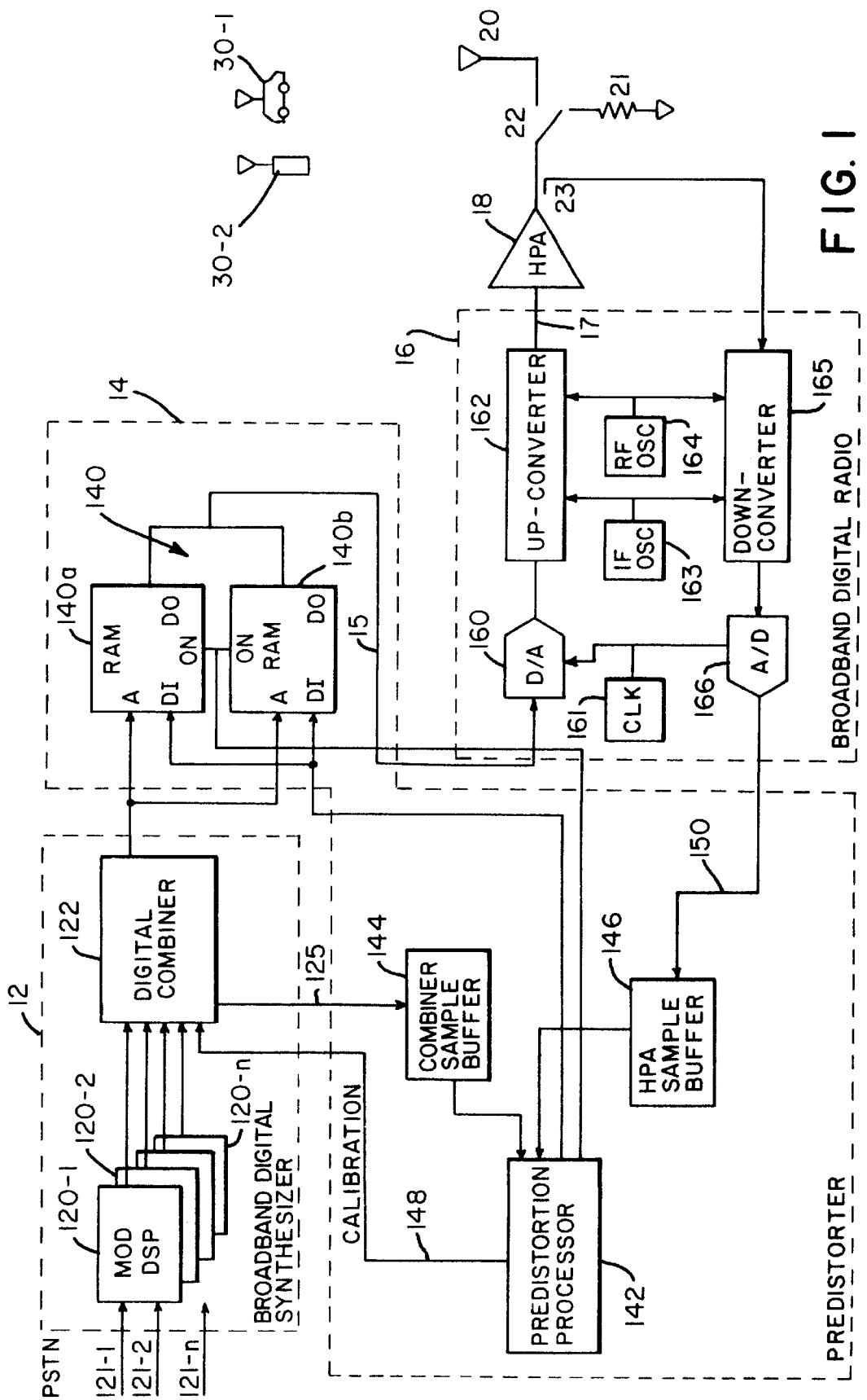
FIG. 1 is a block diagram of a wideband power amplifier making use of digital pre-distortion intermediate frequency stage according to the invention.

FIG. 1 illustrates the transmitter sub-assembly portion 10 of a broadband transceiver system (BTS) consisting of a baseband digital synthesizer 12, a digital predistorter 14, a broadband digital radio 16, a linear multi-carrier high power amplifier (HPA) 18 and antenna 20. In the illustrated embodiment the purpose of the transmitter sub-assembly 10 is to accept multiple digital signals, such as those digitized voice signals typically provided to a base station in a cellular communication system from the public switched telephone network (PSTN) via a multiple digital signal transport signaling mechanism such as T-carrier (T1 or E1) or ISDN, to modulate and convert the multiple digital signals into a composite transmitted waveform suitable for radio transmission over the antenna 20 to remote locations such as the mobile unit 30-1 or portable unit 30-2 (collectively referred to as the mobile stations 30).

The HPA 18 is typically a linear broadband multistage amplifier connected to the output of the transceiver which amplifies the transmitted signal to a power level required to complete a wireless communication link between the transmitter 10 and the multiple mobile stations 30. For example, a transmitter 10 which is to accept ninety-six (96) input channels and make use of the standard Advanced Mobile Phone Service (AMPS) or Global System for Mobile Communication (GSM) type signaling to communicate with mobile stations 30 located a mile or further distant, the multicarrier HPA must typically be capable of providing a total of 100 watts output power at a radio frequency in the range of 800–900 MHz over a bandwidth of approximately 5 MHz, or at least 30 watts of output power at a radio frequency in the range of 1800–1900 MHz.

The invention is a technique for reducing the intermodulation distortion (IMD) and improving the spurious free dynamic range (SFDR) of the HPA 18. In order to accomplish this, the HPA 18 output is connected to the antenna 20 during normal operation but is periodically coupled to a high-power dummy load 21 by operating a switch 22 during a calibration procedure which is described in greater detail below.

A directional coupler 23 or other suitable circuit provides a sample of the output of the HPA 18 at a relatively low level such as −40 decibels (dB) to be used by the calibration procedure to monitor distortion in the output waveform of the HPA 18.

The broadband digital radio 16 accepts a composite baseband digital signal 15 generated from the baseband digital synthesizer 12 as corrected by the predistorter 14 and generates the transmitted multi-carrier radio frequency (RF) signal 17 input to the HPA 18. The broadband digital radio consists of a digital to analog (D-A) converter 160 and associated sample clock circuit 161 to drive the D-A converter 160 at a relatively high speed such as 12.8 MHz, an up-converter 162 consisting of a series of intermediate frequency (IF) and radio frequency (RF) filters, and mixers (not shown) which are driven by a local IF oscillator 163 and RF oscillator 164. The up-converter 162 converts the signal energy baseband in the input composite signal 15 to the desired RF carrier frequency in a well-known fashion.

In accordance with this invention, an additional down-converter signaling path is incorporated into the broadband digital radio to effectively monitor the transmitted signal 17. This is done by making use of the same local oscillators 163 and 164 and sample clock 161 to drive a down-converter 165 and analog-to-digital (A-D) converter 166. The result is to provide a digitized HPA output signal 150 to enable accurate analysis of the distortion present in the up-converter 162 and (HPA) 18 while minimizing the effect of distortion in the measurement process itself.

Turning attention now to the input side of the transmitter sub-assembly 10, the baseband digital synthesizer 12 accepts multiple digital signals from an input signal source such as one or more transport signaling lines from a public switched telephone network (PSTN). A number of modulating digital signal processors 120-1 120-2, . . . , 120-n modulate each of the input digital signals 121-1, 121-2, . . . , 121-m in accordance with the modulation specified by the communication standard in use. For example, in the case of AMPS, the modulating digital signal processors 120 implement frequency modulation to provide a 30 kHz bandwidth baseband signal for each input digital signal 121; in the case of GSM, the modulating digital signal processors produce a time-multiplexed 200 kHz bandwidth signal for every eight input digital signals 121.

The digital combiner 122 is a type of efficient filter bank synthesizer which makes use of multirate digital signal processing techniques to generate a composite baseband digital signal 125 representing the n signals output by the modulating DSPs 120 equally spaced apart in carrier frequency. The digital combiner makes use of multiple convolutional digital filters and a Fast Fourier Transform (FFT). A published Patent Cooperation Treaty Publication number U.S. 95/02997 (AirNet File P009) entitled "Transceiver Apparatus Employing Wideband FFT Channelizer with Output Sample Timing Adjustment and Inverse FFT Combiner for a Multichannel Communication Network" claiming a priority date of Apr. 8, 1994 and which was filed by AirNet Communications Corporation, the assignee of this application describes the details of several preferred embodiments of the digital combiner 122 in greater detail.

The predistorter 14 consists of a look-up table 140, a predistortion processor 142, a combiner sample buffer 144, and an HPA sample buffer 146. The predistorter operates by taking as inputs the composite baseband digital signal 125 generated by the digital combiner 122, the digitized HPA output signal 150, and produces data for the look-up table 140 and a calibration input signal 148.

The look-up table 140 is implemented as a random access memory (RAM) located between the output of the baseband digital synthesizer 12 and the input of the D-A 160 in the broadband digital radio 16. The look-up table provides a transfer function which is inverse in amplitude response as compared to the distortion caused by the broadband digital radio 16 and HPA 18.

In the case of 16-bit digital composite signal 15, the RAM has $2^{16}$ locations and is 16 bits wide. Additionally, in order to ensure that the HPA 18 may be operated while the predistortion processor 142 is performing it operations, the look-up table 140 is preferably implemented as a pair of look-up tables 140a, 140b arranged in a ping-pong fashion so that one look-up table may be written into while the other look-up table is in use by the transmitter sub-assembly 10.

The predistortion processor 142, which is typically a high speed digital signal processor such as the TMS 320 series of processors manufactured by Texas Instruments of Dallas, Tex., performs several operations to determine the values for the calibration look-up table and to support normal operation of the HPA 18. These operations include a crude calibration procedure, a precise calibration procedure, an amplitude distortion calibration procedure, and a normal operation procedure.

Figure 2A:
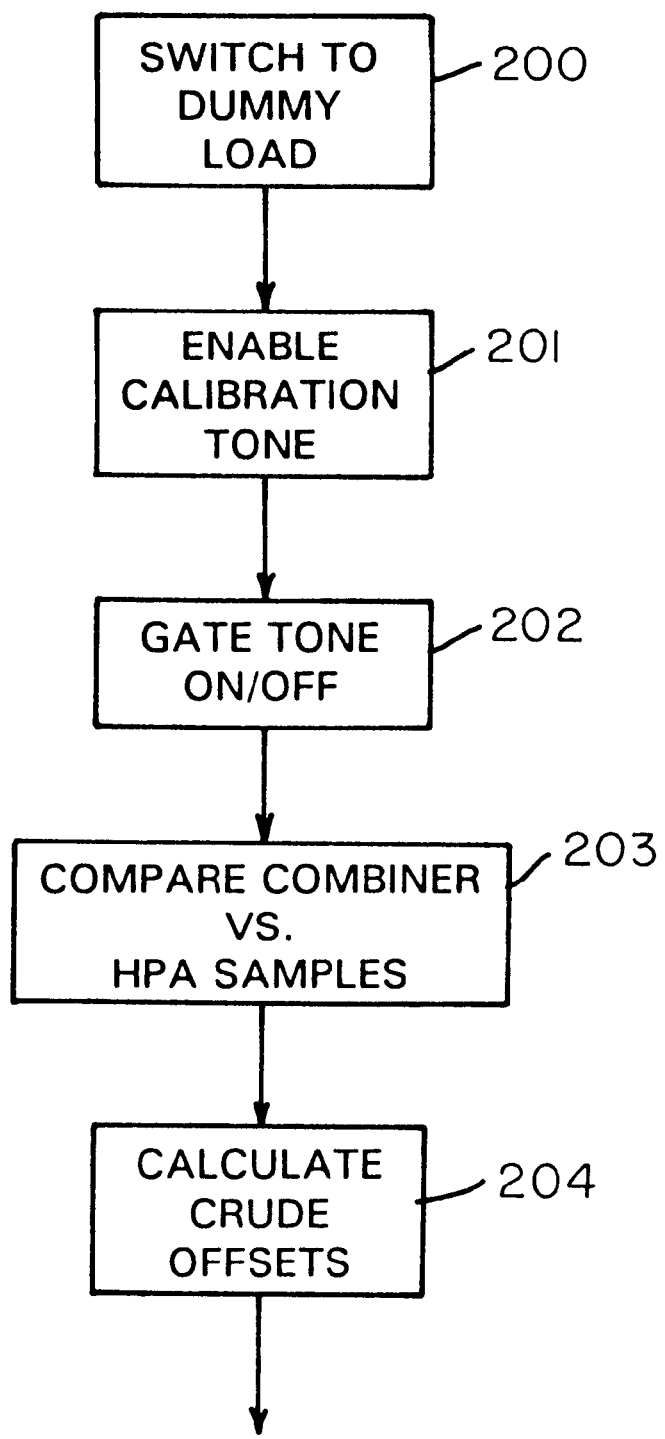
FIGS. 2A through 2D are flow charts of the operations performed by a predistortion correction digital signal processor according to the invention.

A flow chart of the operations performed in the crude calibration procedure is shown in FIG. 2A. Briefly, the overall idea is to store data representing the output of the digital combiner 122 in the high speed first-in first-out (FIFO) combiner sample buffer 144 to data measured at the output of the HPA 18 and stored in the FIFO HPA sample buffer 150.

In a first step 200, the switch 22 is operated to enable connection of the output of the HPA 18 to the dummy load 21. In the next step 201, a low level tone is driven into the HPA 18 such as by driving the calibration input 148 to the digital combiner 122 with digital samples representing the desired calibration tone frequency and with the look-up table values set to an initial value of zero. The calibration tone is preferably selected to be approximately two-thirds (⅔) of the way up along the bandwidth of the digital radio, in the example being described for a 5 MHz radio, this would be approximately 3.33 MHz. The tone is also set to a level which is relatively low such that negligible distortion effects of less than −80 dBc are present at the output of the HPA 18.

In the next series of steps, the tone is gated on and off, in step 202, followed by a step 203 where the combiner response to a particular input value as represented by the output signal 125 as fed through the combiner sample buffer 144 is compared against the HPA output 150 as provided through the HPA sample buffer 146. By gating the tone on and off, a crude amplitude offset can be determined by averaging the difference between the two for each input value. In step 204, the crude amplitude offset values are so determined.

The result of this crude amplitude offset is a first order correction for gain variation in the up-converter 162 and HPA 18. These effects are typically induced by temperature and carrier frequency.

Figure 2B:
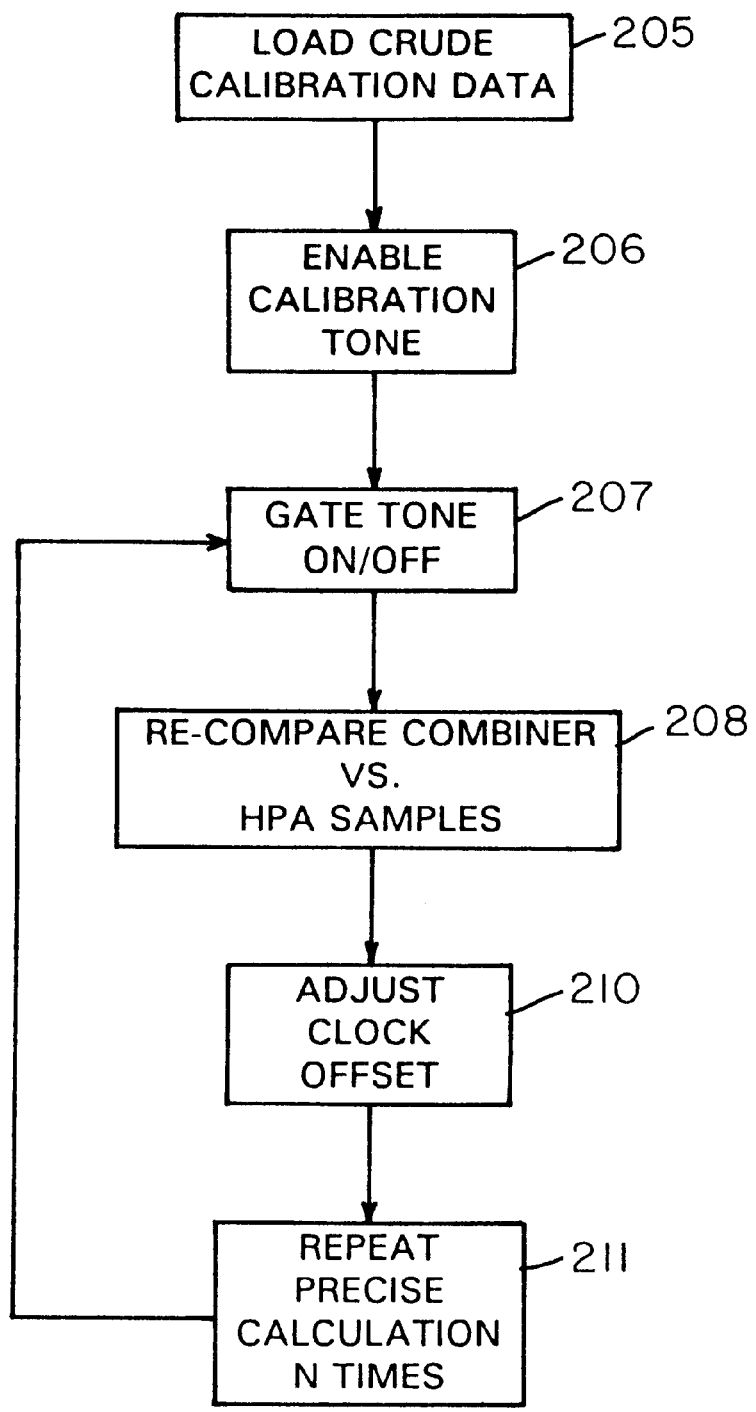

The next sequence of steps, shown in FIG. 2B are performed to determine precise time and amplitude offsets. In a first step 205, the crude amplitude offset values determined in step 204 are loaded into the look-up table 140. A binary search and resampling of the HPA response is then made to establish a time and amplitude reference. Specifically, the calibration tone is enabled once again, in step 205, and then gated on and off again in step 207. The contents of the combiner sample buffer 144 area again compared against the HPA sample buffer 146 to produce a precise set of values for the look-up table 140, in step 208.

The combiner sample buffer 144 and HPA sample buffer 146 are typically cloaked in synchronism with the clock circuit 161. If desired, however, more precise timing correction can be made by controlling the relative clock phases of combiner sample buffer 144 and sample buffer 146. For example, if the sample rate of the D-A and A-D converters 160 and 166 are set at 12.8 MHz, then crude timing procedure heretofore explained provides resolution to at least the nearest clock edge of 78.125 nsec. However, by allowing the predistortion processor 142 to control the exact timing offset between the two buffers 144 and 146 to ½, ¼, ⅛ or smaller portions of a clock cycle steps 210 and 211 can be repeated to take additional reading to determine the position of minimum error. At this point, all calibration data is once again resampled and recalculated (e.g., steps 207 and 208 are repeated), with this minimum timing error offset.

Figure 2C:
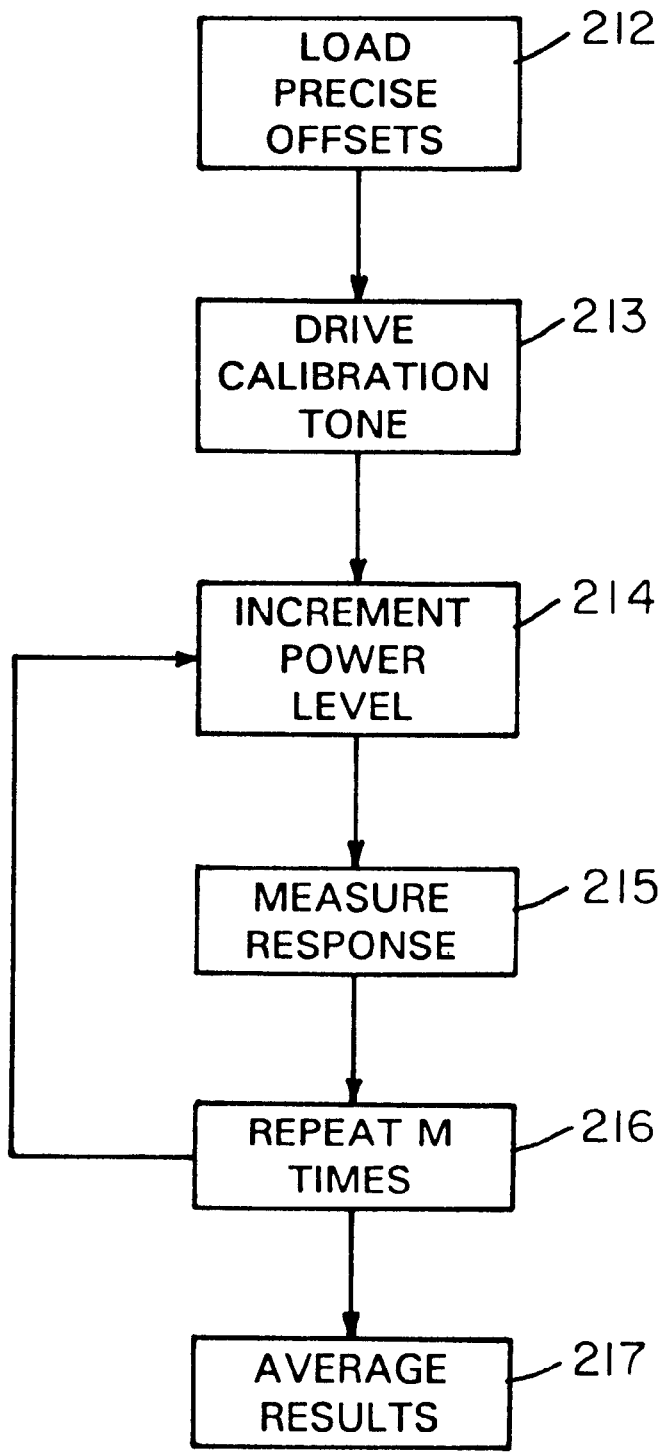

A third procedure is illustrated in FIG. 2C which performs the distortion calibration function after the precise calibration steps. In this procedure the precise offsets are loaded into the look-up table 140 in step 212 and the calibration tone is again driven in step 213. However, this time the power level of the calibration tone is increased in small steps (at least as small as 0.1 dB) with the contents of the HPA sample buffer 146 again being compared to the combiner sample buffer 144 to derive predistortion response data. This results in a set of fixed amplitude and time offsets being precisely calibrated out for the low level undistorted input signal. Steps 214, 215, and 216 are repeated a number of times to increment the power level and measure the response, resulting in an averaged set of values that represent an estimate of amplitude distortion as a function of combiner output level. If it is not practical to calculate all 2 (65,536) levels, then interpolation can be used to fill in the values for the predistortion look-up table 140 which then finally represents the amplitude difference for all 65,526 possible input amplitude levels associated with the digital composite signal 15.

Figure 2D:
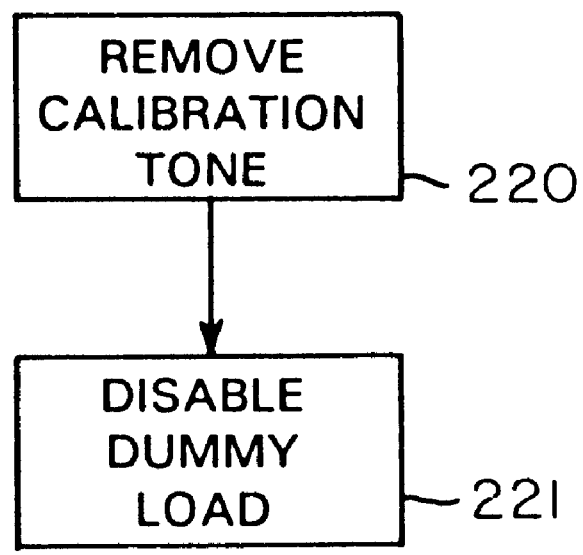

Finally, FIG. 2D illustrates the steps performed by the calibration processor in a normal operation mode in which the HPA is connected to drive the antenna 20, where in step 220, the calibration tone is disabled, and in step 221, the switch 22 is operated to connect the (HPA) 18 to the antenna 20.

As operating conditions change, such as temperature and number of transmit signals and so on, data for the look-up table 140 can be periodically and dynamically recalculated.

It is now understood how a predistortion correction of a composite digital signal is implemented according to the invention to improve the overall intermodulation distortion and spurious free dynamic range in an associated multicarrier high power amplifier.

What is claimed is:

1. In a multichannel carrier radio system such as a cellular base station, a broadband multichannel transmitter assembly comprising:
    digital combiner means, for generating a composite digital signal from a plurality of digital channel signals, the composite digital signal representing a plurality of modulated versions of the digital channel signals offset in carrier frequency from one another;
    broadband digital transmitter means, including a digital to analog converter and up-conversion stage which accept a clock signal and local intermediate frequency (IF) and radio frequency (RF) oscillator signals, for providing a broadband transmit signal, and also including analog to digital conversion means for receiving a high power amplifier feedback signal and converting the high power amplifier feedback signal to a digital HPA signal;
    a high power amplifier, for received the broadband transmit signal from the broadband digital transmitter means, and for providing a high power amplifier (HPA) output signal;
    predistortion correction and calibration means, connected to receive the digital composite signal from the digital combiner means and the digital HPA signal from the broadband digital transmitter means, to produce a correction signal and a calibration signal;
    means, disposed between a broadband digital synthesizer and the broadband digital transmitter means, for storing the correcting signal and applying the correction signal to the digital composite signal; and
    wherein the correction signal is connected to the input of the digital combiner means as one of the digital channel signals during a calibration procedure.

2. An apparatus as in claim 1 wherein the broadband digital transmitter means additionally includes a radio frequency (RF) and intermediate frequency (IF) down-conversion stage that uses the same IF and RF local oscillators that are used to generate the broadband transmit signal.

3. An apparatus as in claim 1 wherein the predistortion correction means generates the correcting signal by determining a difference value between the digital HPA signal and the digital composite signal.

4. An apparatus as in claim 3 wherein the means for storing and applying the correction signal is a look-up random access memory.

5. An apparatus as in claim 4 wherein the predistortion correction means additionally generates the correcting signal by first loading the difference value into the look-up random access memory and then determining a precise correction signal by determining a difference value between the digital HPA signal and the digital composite signal.

6. An apparatus as in claim 5 wherein a relative timing between the digital HPA signal and the digital composite signal is varied to determine the correction signal.

7. A process for calibrating a multicarrier high power amplifier comprising the steps of:
    (a) combining a plurality of digital channel signals and a digital calibration signal to generate a composite digital signal, the composite digital signal representing a plurality of modulated versions of the digital channel signals offset in carrier frequency from one another;
    (b) generating a radio frequency multicarrier signal by digital to analog converting the composite digital signal to produce an analog composite signal and up converting the analog composite signal to a radio frequency signal;
    (c) coupling the radio frequency signal to the high power amplifier;
    (d) correcting the composite digital signal by adjusting the sample values thereof in accordance with stored correction signal values;
    (e) determining the correction signal values by comparing the composite digital signal and a digital high power amplifier response signal representing a digitized version of the response of the high power amplifier;
    (f) setting the correction signal values to zero initially;
    (g) generating the calibration signal as a tone signal of predetermined frequency; and
    (h) determining a set of crude amplitude offset values by gating the calibration tone on and off and comparing samples of the resulting composite signals to samples of the high power amplifier output.

8. A process as in claim 7 additionally comprising the steps of:

(j) storing the crude amplitude offset values as the correction signal values; and (k) generating the calibration signal as a calibration tone to determine a precise set of amplitude offset values by comparing samples of the composite digital signal to samples of the high power amplifier output.

9. A process as in claim 8 additionally comprising the steps of:

(l) storing the precise amplitude offset values as the correction signal values; and (m) applying a plurality of calibration tone signals of incrementally different amplitude to determine the amplitude offset values.

10. A process as in claim 7 additionally comprising the steps of:

(i) adjusting a time of taking samples of the high power amplifier output with respect to a time of taking samples of the composite digital signal.

* * * * *